United States Patent
Lee

(10) Patent No.: US 6,229,705 B1
(45) Date of Patent: May 8, 2001

(54) CLIP FOR SECURING HEAT SINK TO ELECTRONIC DEVICE PACKAGE

(75) Inventor: Hsieh Kun Lee, Chung-Ho (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/602,566

(22) Filed: Jun. 22, 2000

(51) Int. Cl.[7] .................................................. H05K 7/20
(52) U.S. Cl. ..................... 361/704; 361/707; 361/709; 361/710; 257/717; 257/719; 257/727; 174/16.3; 165/80.3
(58) Field of Search ................................ 361/704, 709, 361/710, 717–719, 722; 165/80.3, 185; 257/706, 707, 717–719, 727; 174/16.3; 24/457, 458, 295; 267/150, 160

(56) References Cited

U.S. PATENT DOCUMENTS

| | | | |
|---|---|---|---|
| 5,396,402 | * | 3/1995 | Perugini et al. .................... 361/704 |
| 5,594,624 | * | 1/1997 | Clemens et al. .................... 361/704 |
| 5,602,719 | * | 2/1997 | Kinion ................................ 361/704 |
| 5,617,292 | * | 4/1997 | Steiner .............................. 361/704 |
| 5,933,325 | * | 8/1999 | Hou .................................... 361/704 |
| 5,933,326 | * | 8/1999 | Lee et al. .......................... 361/704 |

* cited by examiner

Primary Examiner—Leo P. Picard
Assistant Examiner—Boris L. Chervinsky
(74) Attorney, Agent, or Firm—Wei Te Chung

(57) ABSTRACT

A clip includes a plastic handle and a metal fastener. The handle is generally T-shaped with an operation section and a joint section extending downwards from the operation section. The joint section forms a pair of hems generally L-shaped and extending toward each other to define a receiving space therebetween. The metal fastener includes a body and first and second arms extending from opposite ends of the body. A pair of protrusions extends from each of opposite edges of the second arm for being interferentially received in the receiving space of the handle thereby securely retaining the handle to the fastener. Flanges extend from opposite edges of the body and are bent to overlap the body for reinforcing the body. Alternatively, a rib is formed on the body for the reinforcement purposes.

4 Claims, 6 Drawing Sheets

CLIP FOR SECURING HEAT SINK TO ELECTRONIC DEVICE PACKAGE

BACKGROUND

1. Field of the Invention

The present invention relates to an apparatus for securing a heat sink to an electronic device package, and particularly to a clip which easily assembles/disassembles the heat sink to/from the package.

2. The Related Art

A heat sink is usually placed in contact with an electronic device package for dissipating heat from the electronic device package. Various clips have been used for attaching a heat sink to an electronic device package.

FIGS. 5 and 6 show a conventional clip 1 for attaching a heat sink 9 to a computer central processing unit (not labeled) retained by a socket assembly 8 to dissipate heat from the central processing unit. The clip 1 comprises a horizontal portion 2 and a pair of spring portions 3 extending from opposite ends of the horizontal portion 2. A pair of legs 4 extends downwards respectively from the spring portions 3. Each leg 4 defines two apertures 5, 6 arranged one above the other. The lower apertures 5 receive corresponding catches (not shown) formed on the socket assembly 8. A pair of handle tabs 7 extends from bottom edges of the upper apertures 6 for facilitating engagement of the clip 1 with the catches of the socket assembly 8.

An operator assembling the clip 1 to the socket assembly may get injured when manually pushing the handle tabs 7 during mounting the clip 1 to the socket assembly 8. Additionally, the mounting efficiency of the clip is low. Furthermore, while such a clip may be mounted to the socket assembly using a tool, the tool could easily slide down and scratch and damage a printed circuit board on which the socket assembly 8 is mounted.

The present invention solves these and other problems of the prior art by providing a clip which attaches a heat sink to an electronic device package simply and reliably.

SUMMARY OF THE INVENTION

Accordingly, an object of the present invention is to provide a clip having a plastic handle which can readily attach/detach the heat sink to/from the electronic package.

To achieve the above-mentioned object, a clip in accordance with the present invention comprises a metal fastener and a plastic handle. The fastener comprises a body and first and second arms extending from opposite ends of the body. At least one protrusion extends from the second arm. The handle comprises an operation section and a joint section extending downwards from the operation section. The joint section defines a receiving space for interferentially receiving the protrusion of the fastener thereby fixing the handle to the fastener. Flanges extend from opposite edges of the body and are bent to overlap the body for reinforcing the body. Alternatively, a rib is formed on the body for reinforcement purposes.

Other objects, advantages and novel features of the present invention will be apparent from the following detailed description of preferred embodiments of the present invention with reference to the attached drawings, in which:

DESCRIPTION OF THE PREFERRED EMBODIMENTS

Figure 1:
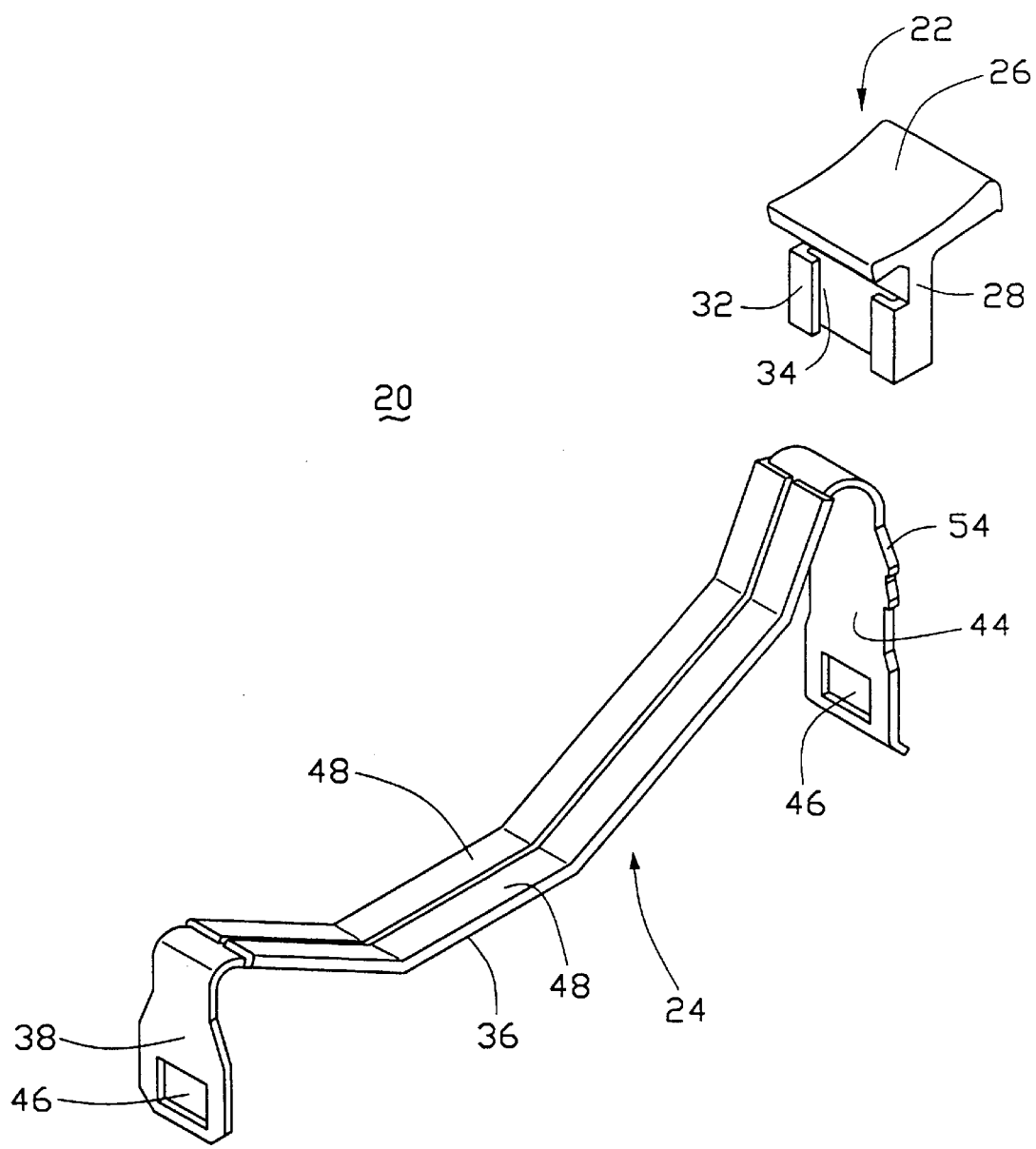
FIG. 1 is an exploded view of a clip in accordance with the present invention.

Referring to FIG. 1, a clip 20 in accordance with the present invention comprises a plastic handle 22 and a metal fastener 24. The handle 22 is generally T-shaped with an operation section 26 and a joint section 28 extending downwards from a bottom side of the operation section 26. The joint section 28 forms a pair of hems 32 at opposite sides thereof. The hems 32 are L-shaped and extend toward each other for defining a receiving space 34 therebetween.

The metal fastener 24 includes a body 36 and first and second arms 38, 44 extending from opposite ends of the body 36. A pair of flanges 48 extends from opposite side edges of the body 36 and are each bent to stack upon the body 36 to reinforce the body 36. A pair of protrusions 54 extends from each of opposite edges of the second arm 44 for being interferentially received in the receiving space 34 of the joint section 28. Each arm 38, 44 defines an aperture 46 for receiving a pair of corresponding tabs 82 formed on a socket assembly 80 (see FIG. 2).

Figure 2:
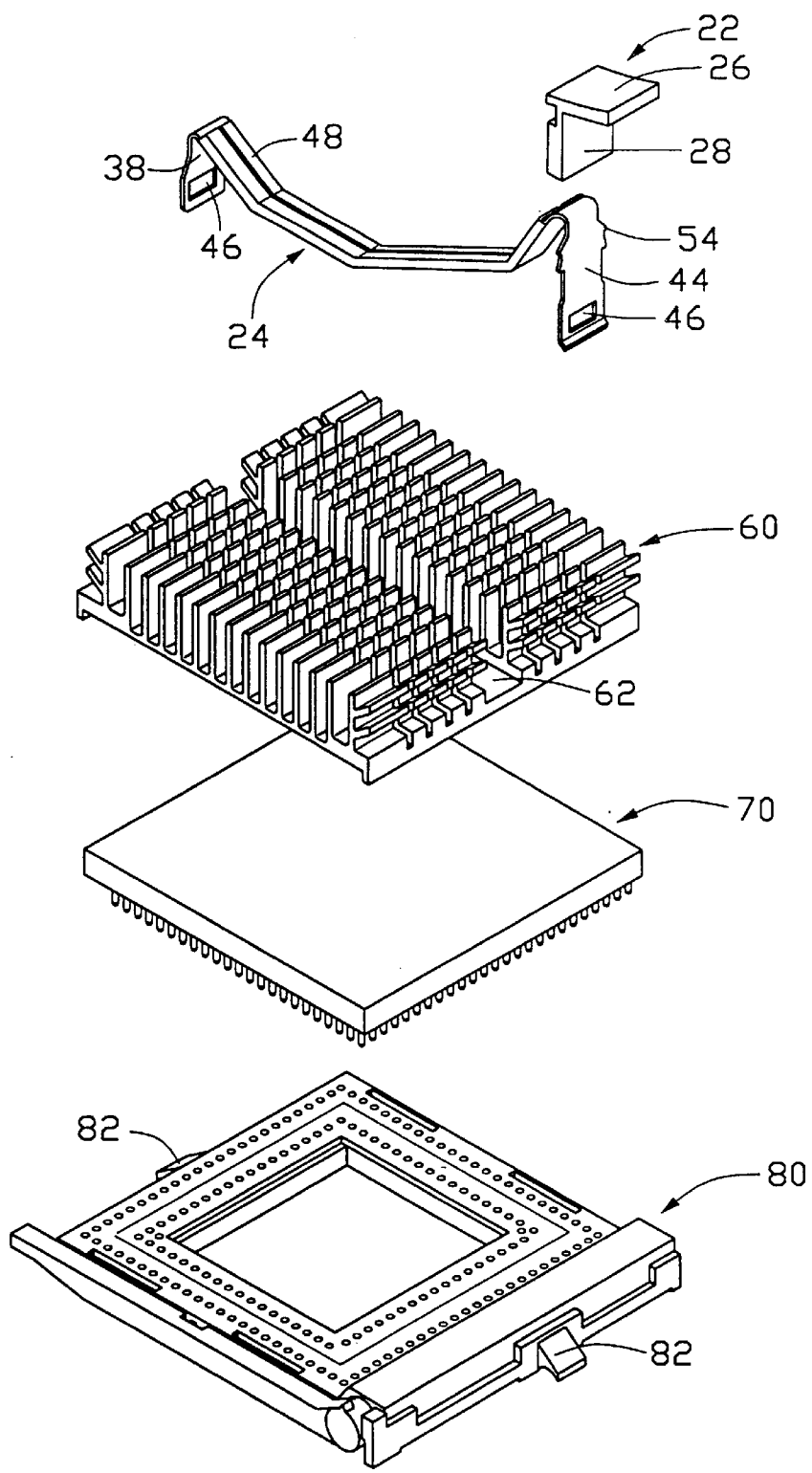
FIG. 2 is an exploded view of a socket assembly with a heat sink to be mounted thereto by the clip of FIG. 1.

Referring to FIG. 2, a central processing unit (CPU) 70 is retained on the socket assembly 80. A heat sink 60 is securely fixed on the CPU 70 by the clip 20 for dissipating heat therefrom. The heat sink 60 defines a recess 62 at a central portion thereof for receiving the body 36 of the clip 20.

Figure 3:
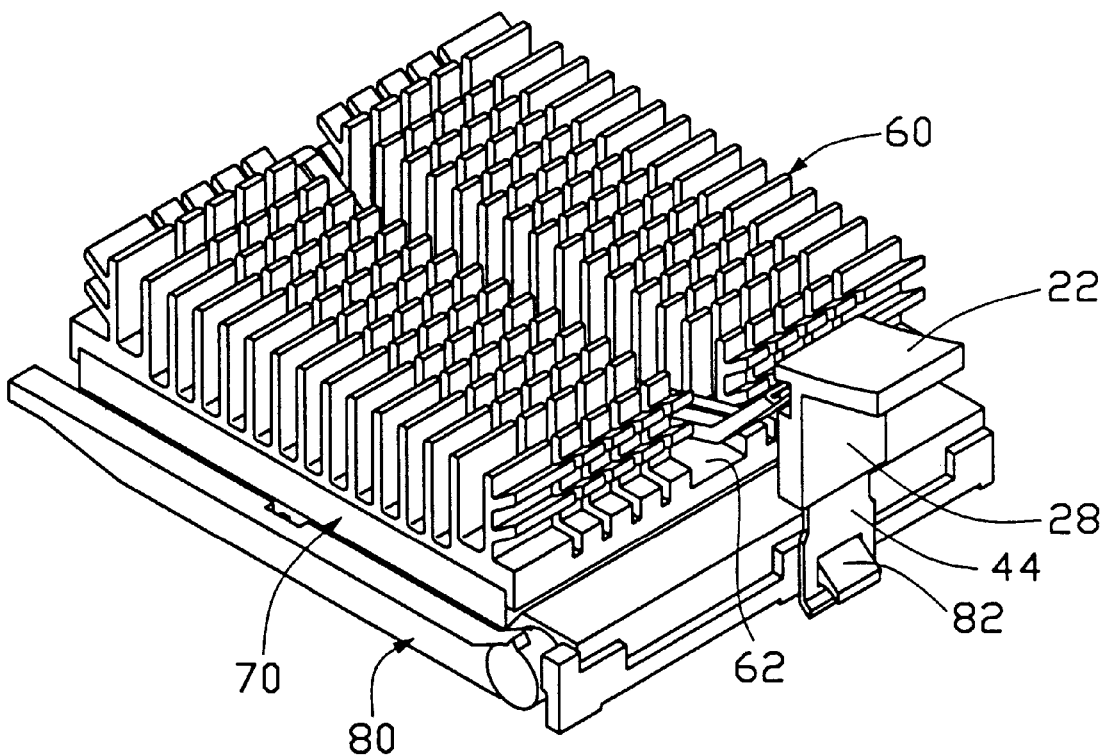
FIG. 3 is an assembled view of FIG. 2.

Referring to FIGS. 1–3, in assembly, the handle 22 is attached to the second arm 44 of the metal fastener 24 by the hems 32 engaging with the protrusions 54 with the operation section 26 abutting against the body 36. The CPU 70 is mounted on the socket assembly 80 and the heat sink 60 is mounted on the CPU 70 with the body 36 of the clip 20 being received in the recess 62. The aperture 46 of the first arm 38 is first engaged with the corresponding tab 82 of the socket assembly 80, and then the operation section 26 of the clip 20 is depressed to cause the aperture 46 of the second arm 44 to engage with the other tab 82 of the socket assembly 80 thereby attaching the heat sink 60 to the CPU 70 and the socket assembly 80.

To release the clip 20, the operation section 26 of the handle 22 is depressed to detach the aperture 46 of the second arm 44 from the tab 82 of the socket assembly 80 thereby allowing disengagement of the clip 20 from the heat sink 60 and the socket assembly 80.

Figure 4:
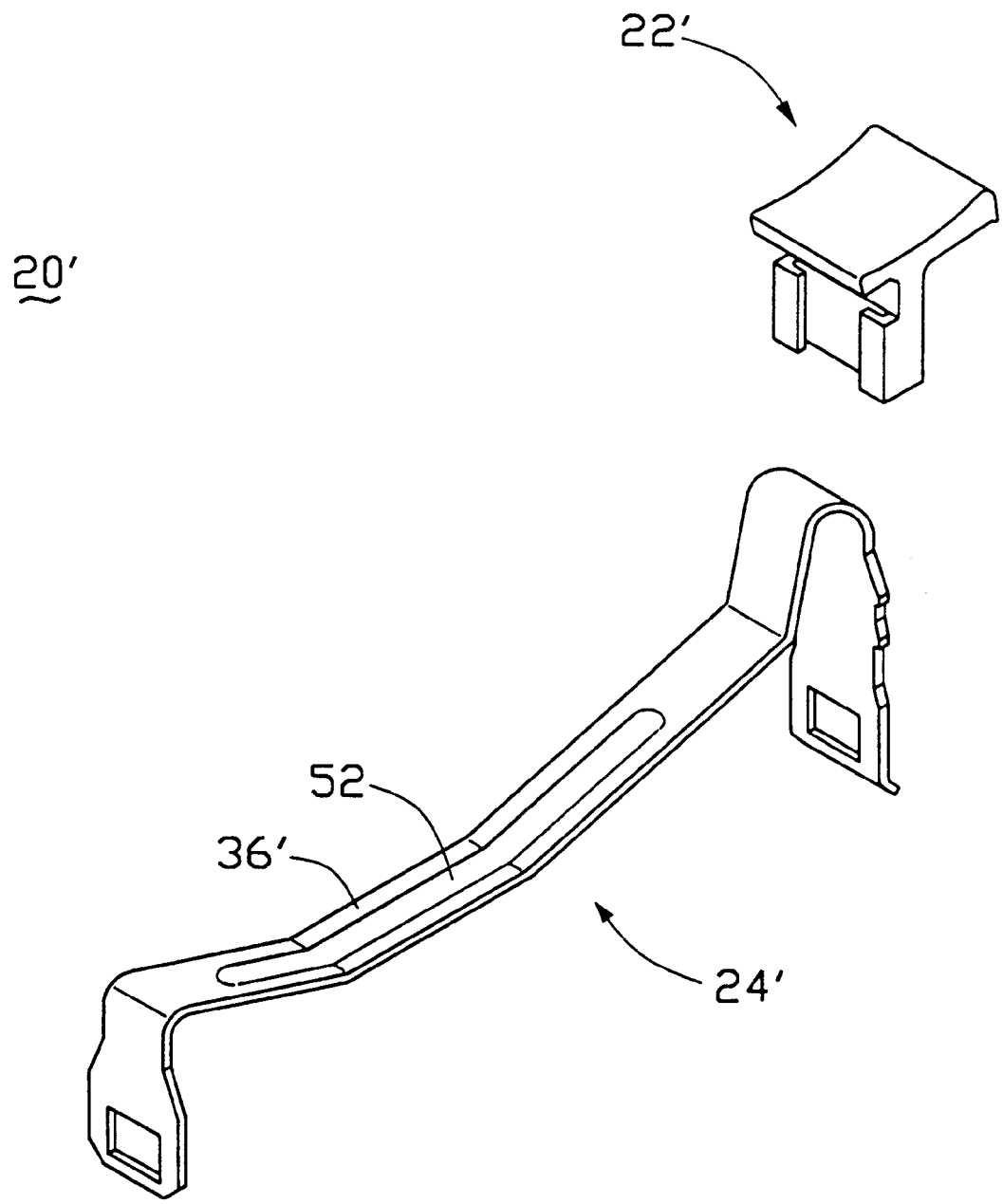
FIG. 4 is an exploded view of a clip in accordance with another embodiment of the present invention.
Figure 5:
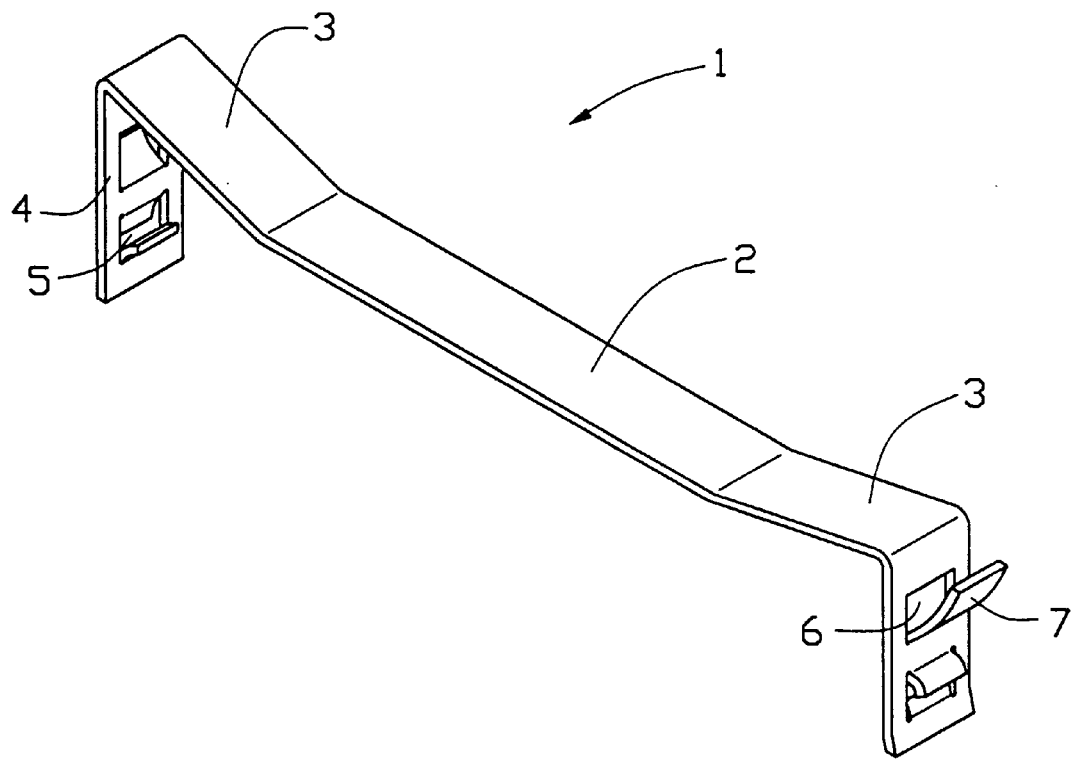
FIG. 5 is a perspective view of a conventional clip.
Figure 6:
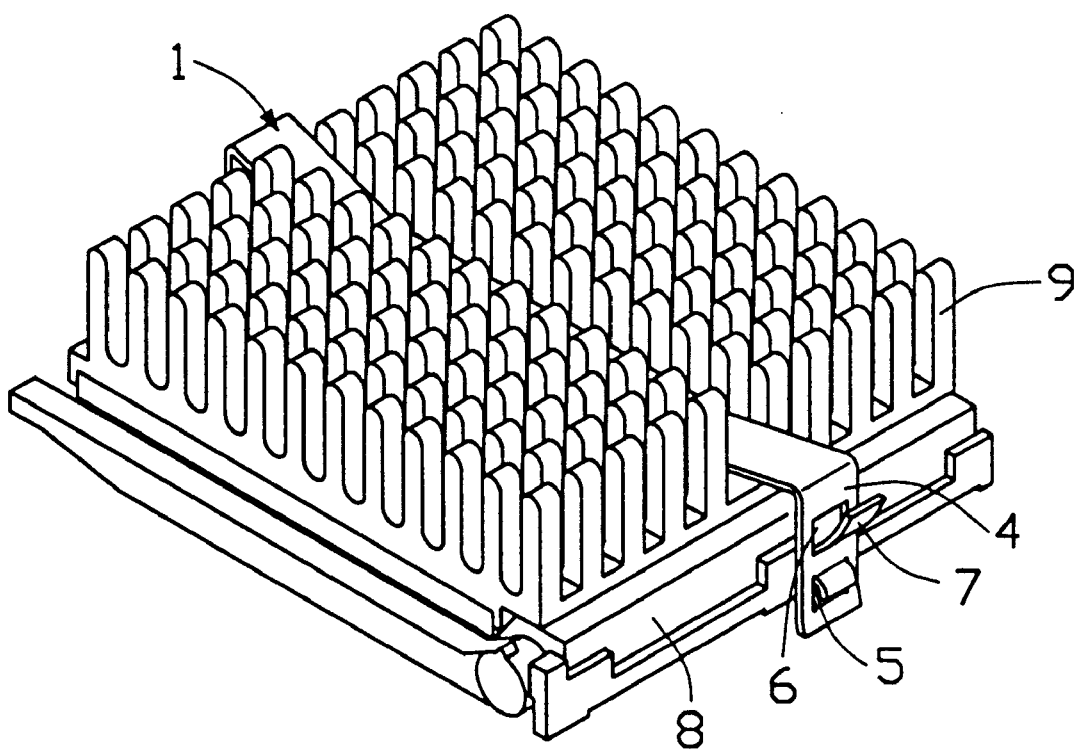
FIG. 6 is an assembled view showing a heat sink attached to a socket assembly by the conventional clip of FIG. 5.

Referring to FIG. 4, a clip 20' in accordance with another embodiment of the present invention comprises a plastic handle 22' and a metal fastener 24'. The metal fastener 24' comprises a body 36' on which a rib 52 is formed for strengthening the body 36'. Except for using the rib 52 in place of the flanges 48 to reinforce the body 36', the clip 20' is substantially identical to that of the clip 20 described with reference to FIGS. 3–5 and thus the description of the clip 20 is also applicable here to the clip 20'.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip for attaching a heat sink to an electronic device package comprising:

a fastener comprising a body and first and second arms extending downwardly from opposite ends of the body; and handle having an operation section and a joint section extending downwardly from the operation section and defining a receiving space interferentially receiving the second arm of the fastener thereby fixing the handle to the fastener; wherein the joint section forms a pair of hems at opposite sides thereof, the hems being L-shaped and extending toward each other to define the receiving space; wherein a pair of protrusions laterally extend from opposite edges of the second arm and are interferentially received in the receiving space of the handle; wherein said joint section is positioned beside the second arm.

2. The clip as described in claim 1, wherein a pair of flanges extends from opposite side edges of the body of the fastener and are each bent to stack upon the body for strengthening the body.

3. The clip as described in claim 1, wherein a rib is formed on the body of the fastener for strengthening the body.

4. The clip as described in claim 1, wherein each arm defines an aperture adapted to engage a corresponding tab formed on the electronic device package for fixing the clip to the electronic device package.

* * * * *